(12) United States Patent
Zhao

(10) Patent No.: US 7,479,672 B2
(45) Date of Patent: Jan. 20, 2009

(54) POWER JUNCTION FIELD EFFECT POWER TRANSISTOR WITH HIGHLY VERTICAL CHANNEL AND UNIFORM CHANNEL OPENING

(75) Inventor: Jian H. Zhao, North Brunswick, NJ (US)

(73) Assignee: Rutgers, The State University, New Brunswick, NJ (US)

( * ) Notice: Subject to any disclaimer, the term of this patent is extended or adjusted under 35 U.S.C. 154(b) by 0 days.

(21) Appl. No.: 11/784,613

(22) Filed: Apr. 9, 2007

(65) Prior Publication Data
US 2007/0187715 A1 Aug. 16, 2007

Related U.S. Application Data

(63) Continuation of application No. 10/671,233, filed on Sep. 25, 2003, now abandoned.

(51) Int. Cl.
*H01L 29/80* (2006.01)
(52) U.S. Cl. .................. 257/256; 257/134; 257/135; 257/272; 257/192; 257/195; 257/274; 257/E27.148
(58) Field of Classification Search ............. 257/134, 257/135, 136, 330, 331, 327, 328, 329, 491, 257/492, 192, 195, 256, 272, 274, E27.148
See application file for complete search history.

(56) References Cited

U.S. PATENT DOCUMENTS 5,903,020 A 5/1999 Siergiej et al.
6,107,649 A 8/2000 Zhao

OTHER PUBLICATIONS

K. Asano, et. al, 5kV 4H-SiC SEJFET with Low RonS of 69 m-ohm-cm2, Proc. of 14th Intnl. Symp. on Power Semiconductor Devices & IC 2002, Jun. 3, 2002, pp. 61-64, IEEE, Piscataway, NJ, USA.

(Continued)

*Primary Examiner*—Evan Pert
*Assistant Examiner*—Tan N Tran
(74) *Attorney, Agent, or Firm*—Lerner, David, Littenberg, Krumholz & Mentlik, LLP

(57) ABSTRACT

A semiconductor vertical junction field effect power transistor formed by a semiconductor structure having top and bottom surfaces and including a plurality of semiconductor layers with predetermined doping concentrations and thicknesses and comprising at least a bottom layer as drain layer, a middle layer as blocking and channel layer, a top layer as source layer. A plurality of laterally spaced U-shaped trenches with highly vertical side walls defines a plurality of laterally spaced mesas. The mesas are surrounded on the four sides by U-shaped semiconductor regions having conductivity type opposite to that of the mesas forming U-shaped pn junctions and defining a plurality of laterally spaced long and vertical channels with a highly uniform channel opening dimension. A source contact is formed on the top source layer and a drain contact is formed on the bottom drain layer. A gate contact is formed on the bottom of the U-shaped trenches for the purpose of creating and interrupting the vertical channels so as to turn on and turn off the transistor.

20 Claims, 15 Drawing Sheets

OTHER PUBLICATIONS

J. Nishizawa, et. al., The 2.45 GHz 35 W CW SI recessed gate type SIT with high gain and high voltage operation, IEEE Trans. on Electron Devices, Feb. 2000, pp. 482-487, vol. 4, No. 2, IEEE, Piscataway, NJ, USA.

H. Onose, et. al., 2KV 4H-SiC junction FETs, Materials Science Forum, 2002, pp. 1227-1230, vols. 389-393, Trans Tech Publications, Switzerland.

Jian H. Zhao et. al, 3.6 m-ohm-cm2, 1,726 4H-SiC normally-off trenched-and-implanted vertical JFETs, 2003, pp. 50-52, ISPSD, IEEE, Piscataway, NJ, USA.

Jian H. Zhao, et al., Demonstration of a high performance 4H-SiC vertical junction field effect transistor without epitaxial regrowth, Feb. 2003, pp. 321-323, Electronics Letters, IEE, Stevenage, SG1 2SD, UK.

POWER JUNCTION FIELD EFFECT POWER TRANSISTOR WITH HIGHLY VERTICAL CHANNEL AND UNIFORM CHANNEL OPENING

CROSS-REFERENCE TO RELATED APPLICATIONS

This application is a continuation of U.S. application Ser. No. 10/671,233, filed on Sep. 25, 2003, the disclosure of which is incorporated herein by reference.

FIELD OF INVENTION

This invention relates to the creation and design of power semiconductor switches. More specifically, this invention relates to vertical junction field-effect power transistors with long vertical channels all having a highly uniform channel opening dimension defined and controlled by highly vertical $p^+n$ junctions.

BACKGROUND OF THE INVENTION

SiC power devices have been intensively investigated for the past 13 years. High power SiC vertical junction field effect-transistors (VJFETs) have attracted great attention for high temperature applications because VJFETs do not suffer from the low channel mobility problem of SiC MOSFETs. One SiC VJFET attempt, U.S. Pat. No. 6,107,649 to J. H. Zhao entitled *Field-controlled high power semiconductor devices,* the disclosure of which is hereby incorporated as reference, solves the problem of high electric field in the gate oxide of SiC MOSFETs by using lateral FETs to control the conduction of vertical channels without the need of epitaxial regrowth. FIG. 1 is a copy of FIG. 6A from U.S. Pat. No. 6,107,649. Another attempt, as found in the paper by K. Asano et al. entitled *5 kV 4H—SiC SEJFET with low RonS of 69 mΩcm²* published in IEEE ISPSD-2002, pp. 61-64, cited herein as reference, has described a normally-off VJFET as shown in FIG. 2 which also uses a lateral JFET to control a vertical channel but requires expensive epitaxial regrowth at the middle of the device fabrication. The use of lateral JFET clearly results in higher device resistance leading to low current capability.

Purely vertical JFETs without the lateral JFETs have also been attempted but mostly in the forms of static induction transistors (SITs) which do not have long and highly uniform opening vertical channels defined and controlled by vertical pn junction gates. One attempt, as shown in FIG. 3, FIG. 4 and FIG. 5 which are copies of FIG. 5, FIG. 3 and FIG. 10, respectively, from U.S. Pat. No. 5,903,020 to R. R. Siergiej et. al. entitled *Silicon Carbide static induction transistor structure,* cited herein as reference, describes the formation of the p+ gates by normal incident, planar ion implantation on planar surface as shown herein in FIG. 3, by normal incident, planar ion implantation onto shallowly etched surface as shown herein in FIG. 4, and by normal incident, planar ion implantation onto only the deep trench bottoms as shown herein in FIG. 5. These planar, normal incident ion implantation approaches do not result in long vertical channels with uniform channel opening dimensions as stated in U.S. Pat. No. 5,903,020. Without highly uniform opening and long vertical channel, these SITs can not support high voltages. Besides they are difficult to be made normally-off switches capable of high voltage and high current. FIG. 6, a copy of FIG. 1 in the paper by J. Nishizawa et al. entitled *The 2.45 GHz 36 W CW Si recessed gate type SIT with high gain and high voltage operation* in *IEEE Transactions on Electron Devices,* Vol. 4, No. 2, February 2000, pp. 482-487, cited herein as reference, shows the well known silicon-based SIT design similarly without long vertical channels of a highly uniform channel opening dimension defined and controlled by $p^+n$ junctions. One attempt has been reported to develop purely vertical JFETs with long vertical channels up to 2 um by Mega-eV ion implantation but without a highly uniform channel opening dimension, as shown in FIG. 7 which is a copy of FIG. 1 in the paper by H. Onose, et al. entitled *2 kV 4H—SiC junction FETs* published by Materials Science Forum, Vols. 389-393, 2002, pp. 1227-1230, cited herein as reference. The long vertical channel defined by $X_j=2$ um shown herein as FIG. 7 has a curved channel with a highly non-uniform vertical channel opening and a minimum opening dimension of Wch. In fact, SIT and VJFET gates formed by normal incident ion implantation generally lead to highly non-uniform channel opening dimensions similar to the curved channel of FIG. 7. Although the channel is near 2 um, the vertical part of the channel that has the same channel opening dimension is negligible in comparison to the total channel length. Hence, with a gate to source reverse bias as high as 50V to shut off the channel and create a large enough source-to-drain barrier, the vertical JFET blocks only 2 kV, much below the theoretical blocking voltage limit of >3 kV for the 20 um thick structure shown in FIG. 7 because of the absence of a long vertical channel with a highly uniform channel opening dimension. Besides, the device specific on-resistance is as high as 70 mΩcm². Furthermore, the vertical JFET is a normally-on switch, again due to the absence of long vertical channel with a highly uniform opening dimension defined and controlled to be normally-off by highly vertical $p^+n$ junctions. In fact, to the best of the inventor's knowledge, no normally-off VJFETs have been reported without using the present invention, although high power control systems clearly need normally-off switches to provide the important fail-safe protection. It would be clear to those skilled in the art that, to achieve a low device resistance in the conduction mode and to block high voltage in the blocking mode, a high voltage VJFET requires a large depth of the barrier between the drain and source to prevent the well know drain-induced barrier lowering (DIBL) in FETs which leads to high leakage current and early breakdown of the switch. When the potential barrier along the source to drain direction is short in barrier depth as is the case for the vertical JFET shown in FIG. 7 and SITs shown in FIGS. 3, 4, 5, and 6 as well as any other VJFETs and SITs with vertical channel defined by normal incident ion implantation gate, a large enough drain (blocking) voltage will pull down the barrier, causing electrons to flow from the source over the reduced barrier to the drain resulting in high leakage and early breakdown. Hence, up to date, all reported pure VJFETs and SITs without using present invention are normally-on and require a large negative gate voltage to over-pinch and shut off the channel so that a large enough source-to-drain barrier depth can be created for the devices to block high voltages. But gate-to-source pn junctions heavily doped on both sides tend to have a lower breakdown voltage and a larger leakage current under high reverse gate bias, not desirable for high power transistors.

Therefore, it is obvious to those skilled in the art that pure vertical JFETs with gate junctions formed by normal incident ion implantation without long vertical channels of a highly uniform channel opening dimension are not desirable for the implementation of normally-off operation. It is also obvious to those skilled in the art that pure vertical JFETs can not offer optimum normally-on operation when the gate junctions are formed by normal incident ion implantation without long vertical channels of a highly uniform channel opening dimension because an excessive negative gate bias is needed to create a barrier with enough depth to block desired voltages.

There is, therefore, a clear need to design a better performing SiC VJFET with long vertical channels all having a highly uniform channel opening dimension defined and controlled by highly vertical gate $p^+n$ junctions so that higher power capability can be achieved with lower device resistance for either normally-off or normally-on operation.

SUMMARY OF THE INVENTION

This invention provides new designs and implementations of pure vertical JFETs (VJFETs) ideally suited for realization in wide bandgap semiconductors such as SiC, GaN, diamond and the more traditional semiconductors such as silicon and GaAs as well as any other semiconductors suitable for high power and high frequency applications. The device includes a large number of paralleled cells fabricated on wafers with an $n^+$-$n^-$-$n$-$n^{++}$ structure, where the $n^{++}$ is the top source layer for the source ohmic contact and for defining the boundary of the vertical $p^+n$ junction gates remote from the top surface. The $n^-$ layer forms the drift or blocking layer. The n layer is the channel layer used to form the vertical mesas and vertical channels. The n- layer is for the blocking layer. The $n^+$ region is the bottom drain layer or substrate upon which the $n^-$ blocking layer, the n channel layer n and the $n^{++}$ source layer are grown. Each cell contains a highly vertical mesa defined by deep U-shaped trenches in the semiconductor with the center region of each mesa forming the long vertical channel of the cell. On each of the four side walls of a mesa, a U-shaped gate $p^+n$ junction is formed by angled or tilted ion implantation of acceptors whose energy controls the vertical channel opening dimension, resulting in a highly uniform vertical channel opening. Gate ohmic contacts are placed on the bottom of the U-shaped trenches on $p^{++}$ region selectively formed by ion implantation on the bottom of the U-shaped $p^+n$ junction. The trenches are planarized by a standard planarization technique such as spin-coating of polyimide. Source ohmic contacts are placed on the mesa surface of the $n^{++}$ top source layer. Drain ohmic contact is formed on the $n^+$ bottom surface of the bottom drain layer. The $n^-$ blocking layer and the n channel layer can be combined into a single n layer when separate optimization of the blocking and channel layers are not required.

DETAILED DESCRIPTION OF THE PREFERRED EMBODIMENTS

Figure 8:
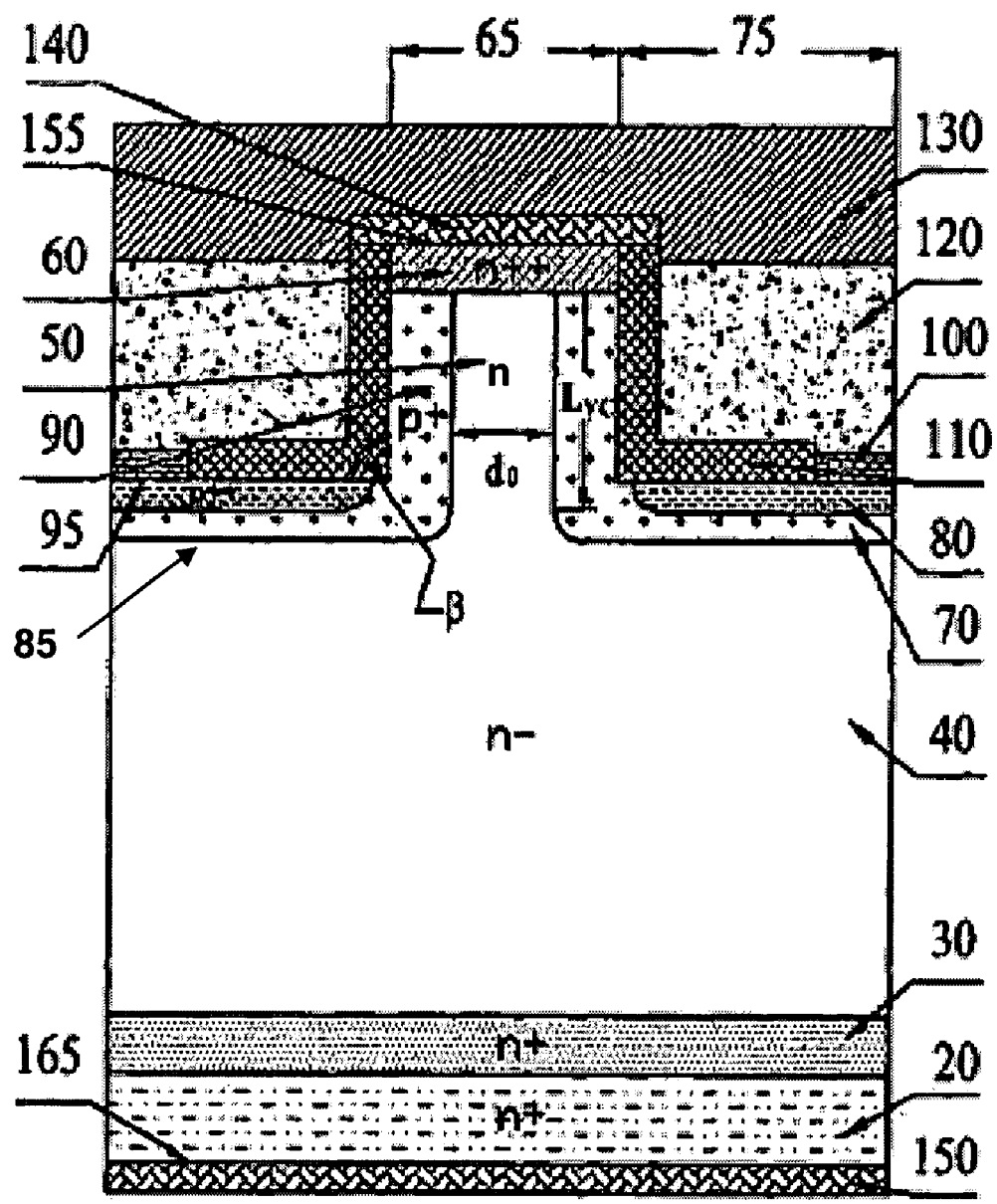
FIG. 8 shows a cross sectional view embodying one form of the invention.
Figure 8A:
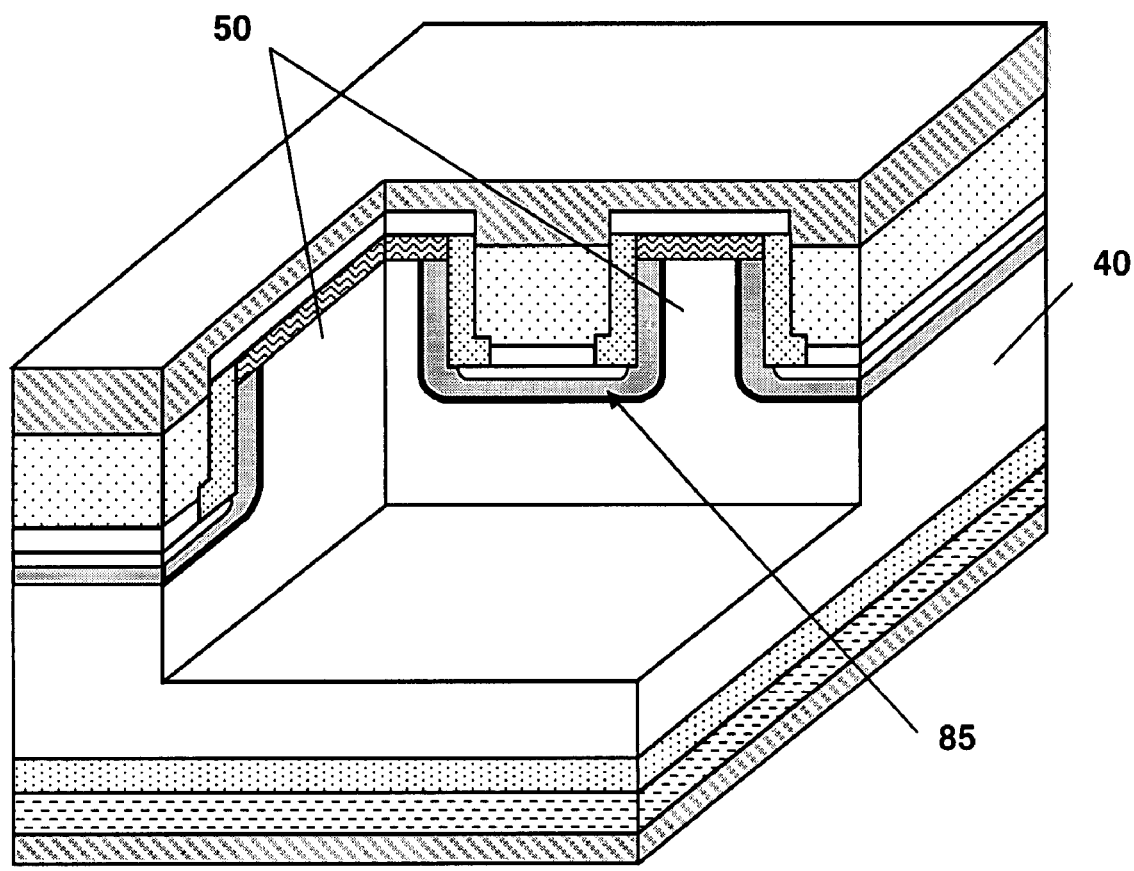
FIG. 8a shows a three-dimensional cross section view of the embodiment shown in FIG. 8.

Now referring to FIG. 8 with one embodiment of the VJFET where a four-layer semiconductor structure having top surface 155 and bottom surface 165 is used to fabricate the VJFET. The cross section of FIG. 8 corresponds to a unit cell of the VJFET. A complete VJFET is formed by repeating this unit cell resulting in a large number of cells in parallel. Two unit cells of the VJFET are visible in the three-dimensional cross section view shown in FIG. 8. The bottom drain layer 20 is a heavily doped $n^+$ bulk semiconductor upon which the epilayers are grown. On top of layer 20 is first grown a lightly doped thick $n^-$ drift layer 40 followed by an n type channel layer 50. For better layer quality, an epitaxial $n^+$ buffer layer 30 can be used between layer 40 and substrate 20. The thicknesses and doping concentrations for layers 40 and 50 are determined by the desired device voltage blocking capability and current requirement through well known device physics equations. Following layer 50 is an $n^{++}$ layer 60 with a doping density higher than that of the $p^+$ gate and with a thickness larger than the etch depth non-uniformity in photoresist (PR) and dielectric (such as polyimide) etch-back during a standard semiconductor planarization process. The etch depth non-uniformity in semiconductor planarization process varies, depending on equipment used and processes employed, but is generally within the range of 0.2 to 2 um although non-uniformity outside this range is also possible. Layer 60 can also be formed by ion implantation of donors, such as P or N either at room temperature or at high temperatures. The device includes the drain ohmic contact 150; the vertical p+ gate 90 which, in this embodiment, is formed by first etching deep U-shaped trenches (regions) 85 to form mesas 65 with highly vertical ($\beta\approx90°$) side walls. Each mesa is rectangular shaped and bounded on four sides by a U-shaped trench. FIG. 8 shows half of a U-shaped trench 85 to the left of mesa 65 and half of another U-shaped trench to the right of mesa 65. A complete U-shaped trench 85 is shown between two mesas in FIG. 8A. As described hereinafter, the walls of the U-shaped trenches form the basis for U-shaped gate ($p^+n$) junctions. After the mesas have been formed by etching the U-shaped trenches, tilted or angled acceptor ion implantation is applied to the four sides of the mesa walls with a density lower than the donor density of the top source $n^{++}$ layer 60, which is typically 2 to $10\times10^{18}$ cm$^{-3}$ or higher, to form the highly vertical p+ gate 90 which surrounds each mesa 65 on four sides and defines a highly vertical channel 50 with a highly uniform channel opening dimension ($d_0$); the p+ trench bottom region 70 (or p+ body region 70) typically doped in $10^{18}$ cm$^{-3}$ range is formed by normal incident acceptor implantation; the p$^{++}$ selectively and heavily doped region of 80 which is for better gate ohmic contact formation and is formed together with region 70 but with increased acceptor dose near the surface region 95; the gate ohmic contact 100 to the p$^{++}$ region of 80, which is internally connected to the vertical p+ gate region 90; the passivation region 110 which can be formed by thermal oxidation followed by PECVD SiO$_2$ and PECVD nitride; the metal ohmic contact 140 to the n$^{++}$ source region 60; the dielectric trench fill 120 which planarizes the whole device surface; and the source metal overlay 130 which connects all the sources of individual cells. The vertical depth of the trench and the vertical depth of the p$^+$ body implantation (region 70) together determine the length ($L_{vc}$) of the highly vertical part of the channel. The length of $L_{vc}$ should be designed to provide a negligible effect of the well know FET DIBL barrier lowering. It should be obvious to those skilled in the art that there is a trade-off in the blocking voltage and device resistance. A longer channel length $L_{vc}$ results in a larger channel resistance but a larger source-to-drain barrier, leading to a lower leakage current and a higher blocking voltage while a shorter channel length $L_{vc}$ results in a smaller channel resistance but a DIBL barrier lowering and a higher leakage current, leading to a lower blocking voltage. Simulation results show that $L_{vc}$ of 2.1 um can be used to implement SiC VJFETs up to 14 kV as will be described in the section on examples. It is obvious to those skilled in the art that a $L_{vc}$ shorter than 2.1 um can be used for lower voltage VJFETs. For SiC VJFETs of 1.7 kV to 14 kV, $L_{vc}$ in the range of 1 to 2.1 um can be used. For VJFETs of a few hundred volts to 1.7 kV, $L_{vc}$ in the range of 1.5 to 0.5 um can be used. The exact optimum length of Lvc depends not only on the maximum blocking voltage but also on the maximum allowed leakage current between source and drain of the VJFET and the normally-off or normally-on mode of operation which are all governed by the well known semiconductor device equations. For the vertical gate p+ implantation, the desired tilted angle, the implantation energy and the dose of acceptors depend on the desired vertical channel opening dimension which is largely determined by the channel doping concentration and the gate p$^+$n junction built-in voltage. For normally-off VJFET design, the vertical channel opening should be completely depleted by the built-in voltages of the p$^+$n junctions on each side the vertical channel. Because of the excellent highly vertical mesas that can be formed by dry etching and the tilted implantation with implantation depth that can be accurately controlled by implantation energies, the vertical channel opening dimension can be controlled to very high accuracy in the submicron range, only limited by the masks used to define the source mesas.

Figure 9:
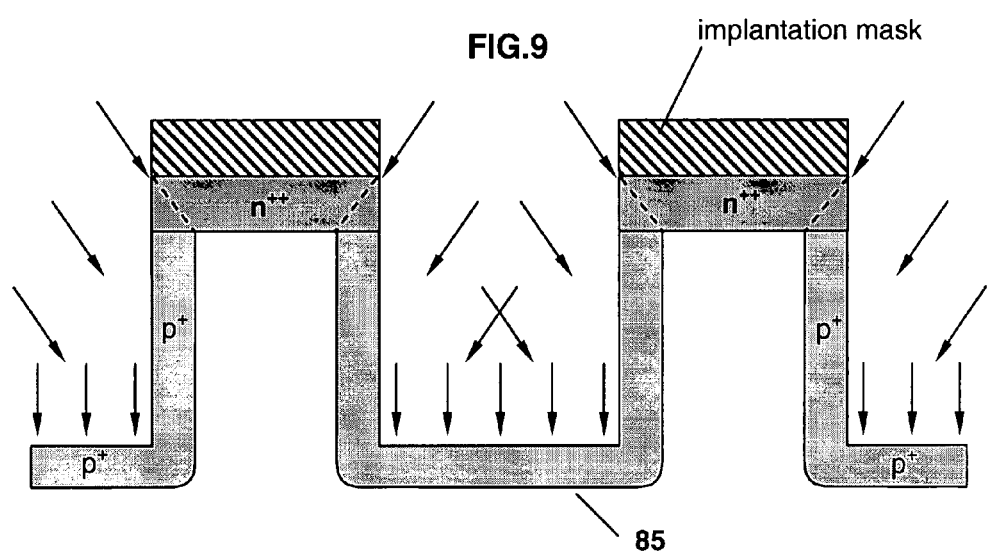
FIG. 9 shows cross sectional view of formation of a long vertical channel with a highly uniform channel opening dimension by titled ion implantation of acceptors using thick and heavily doped $n^{++}0$ source layer by a self-aligned process.

In order to experimentally achieve the highly vertical channel with a highly uniform opening dimension throughout the entire vertical channel region and the entire wafer, it is critically important to use a heavily doped thick n$^{++}$ source layer 60, thick enough so that (i) self-aligned (by using metal on mesa as implantation mask) and tilted or angled implantation can be used to create p+ vertical side walls without converting any part of the top source layer 60 from n-type to p-type (as illustrated by FIG. 9 where the parts of the source layer 60 below the dashed lines are implanted by acceptors but maintain the n-type property and (ii) the whole device surface can be planarized without exposing the top edge of the vertical p+ gate region 90 so that it is possible to form the source contact 140 and the final metal overlay 130 connecting all the source regions without shorting the top edge of the vertical p$^+$ gate 90 and the source ohmic contact 140 and source metal overlay 130. Vertical arrows in FIG. 9 indicate the direction of p+ body normal incident ion implantation. Tilted arrows in FIG. 9 show the direction of tilted angle ion implantation for the creation of the vertical p+ gate regions. Without a proper design of a heavily doped n$^{++}$ source region 60, the part of the n-type source layer subjected to acceptor implantation can be converted to p-type after the tilted, angled implantation to the vertical side walls of the mesa, making it very difficult to define the source ohmic contact without causing a short-circuit between the source contact metal 140 and the p$^+$ gate region 90. Similarly, without a thick enough n$^{++}$ source layer 60, even if the source layer is doped very heavily, it would also be very difficult to form the source contact 140 and the subsequent metal overlay 130, without causing short-circuit between the source metal and the top of the p$^+$ gate. This is why the n$^{++}$ layer 60 should be thicker than the etch depth non-uniformity encountered in the photoresist (PR) and dielectric (such as polyimide) etch-back during a standard semiconductor planarization process. The etch depth non-uniformity in semiconductor planarization process varies, depending on equipment used and processes employed, but is generally within the range of 0.2 to 2 um although non-uniformity outside this range is also possible. A thick enough n$^{++}$ layer 60 would allow the use of self-aligned processes to define source ohmic metal contact 140 to the top of the mesa surface 150, and to form a thick metal overlay 130 connecting all mesa tops without shorting the p$^+$ gate 90 and the n$^{++}$ source 60.

In the blocking mode, the VJFET of FIG. 8 operates by applying a high blocking voltage to the drain with respect to the source. For a normally-off VJFET, the vertical channel is off when there is no gate-to-source bias. For normally-on VJFET design, a reverse bias across the gate-to-source p$^+$n$^{++}$ junction needs to be applied to turn-off the vertical channel. When the vertical channel is completely depleted, the reverse biased p$^+$ (70)-n$^-$(40) junction blocks the drain to source voltage. As the drain-to-source reverse bias is increased, the depletion width around the vertical p+gate regions on either sides of the vertical channel 50 expands and substantially shields the source 60. The maximum blocking voltage is therefore determined largely by the reverse biased p+-n$^-$ structure formed by the p$^+$ body region 70 and the n$^-$ blocking region 40. For a normally-off VJFET, a forward bias across the gate and source p$^+$n$^{++}$ junction drives the device into the conduction mode by reducing the depletion width and opening up the vertical channel so that current conducts between the drain and source. The forward bias does not need to fully turn on the gate-to-source p$^+$n$^+$ diode and the forward current going through the gate can be negligible in comparison to drain to source current. For normally-on VJFETs, reducing the reverse bias across the gate-to-source pn junction would open up the vertical channel and lead to current conduction between the drain and source. For a better surge current handling capability, this unipolar VJFET can also be operated in hybrid mode with a small quantity of hole injection by simply increasing the gate-to-source forward bias. The device is turned off after removing the gate-to-source bias in the case of normally-off VJFETs and after increasing the reverse gate-to-source bias to shut off the vertical channel in the case of normally-on VJFETs.

Figure 10:
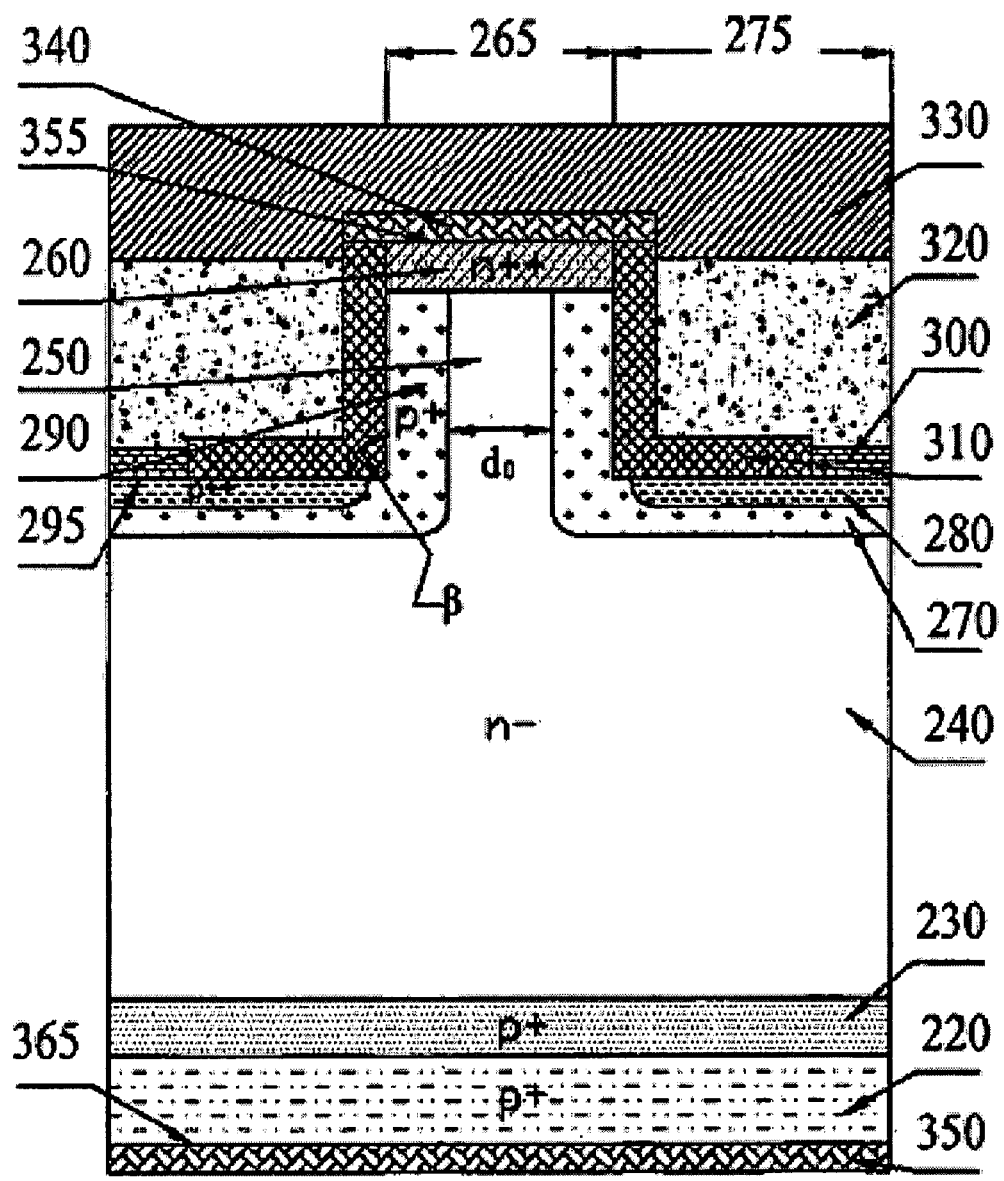
FIG. 10 shows cross sectional view embodying another form of the invention.

Referring now to FIG. 10 with another embodiment of the invention where a bipolar VJFET is disclosed. The difference between the embodiment of FIG. 10 and the embodiment of FIG. 8 is in the use of bottom drain layer and buffer layer with conductivity type opposite to that of the blocking layer in FIG. 10. Specifically, the bottom drain layer 220 in the specific illustration of FIG. 10 is a heavily doped p-type substrate. The buffer layer 230 shown in FIG. 10 is also a heavily doped p-type layer. The use of a bipolar drain junction results in a bipolar-mode VJFET which has a highly vertical channel with a highly uniform channel opening. For blocking operations, the bipolar-VJFET is biased in the same way as a unipolar VJFET of FIG. 8. The vertical channel is pinched off at zero (reverse) gate-to-source bias for normally-off (normally-on) VJFETs and the blocking voltage is supported by the reverse biased $p^+$ (270)-$n^-$(240) junction. To turn on the device, an appropriate gate bias is applied to open up the vertical channel to allow current passing from the drain to the source. Because the drain-to-source is formed by a $p^+$-$n^-$-$n^{++}$ structure in this bipolar VJFET instead of the $n^+$-$n^-$-$n^{++}$ structure in the unipolar VJFET, conductivity modulation due to hole injection into the thick n-type lightly doped blocking layer 240 will substantially reduce the device specific on-resistance.

Figure 1:
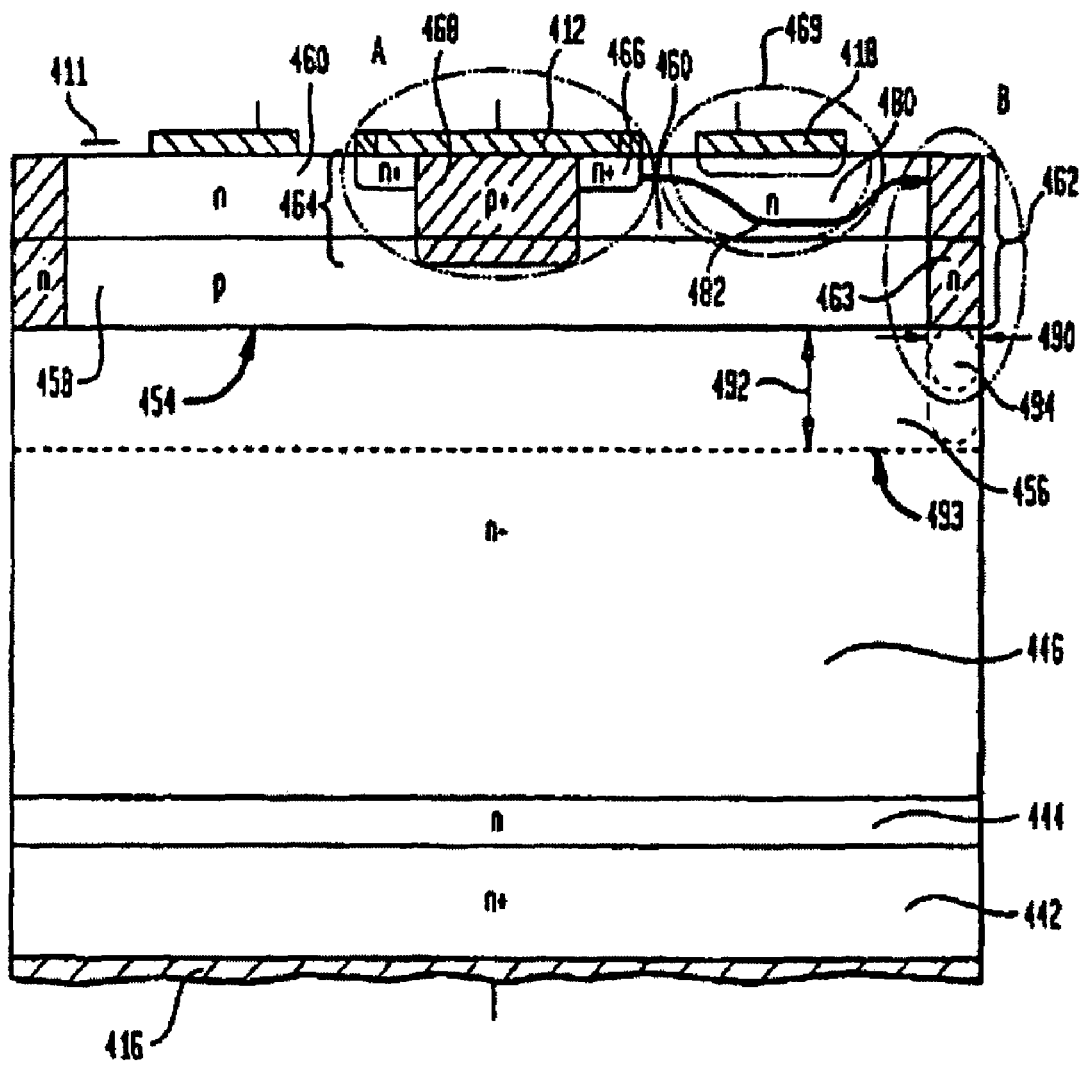
FIG. 1 shows prior art in the design of SiCVJFETs with lateral JFETs.
Figure 2:
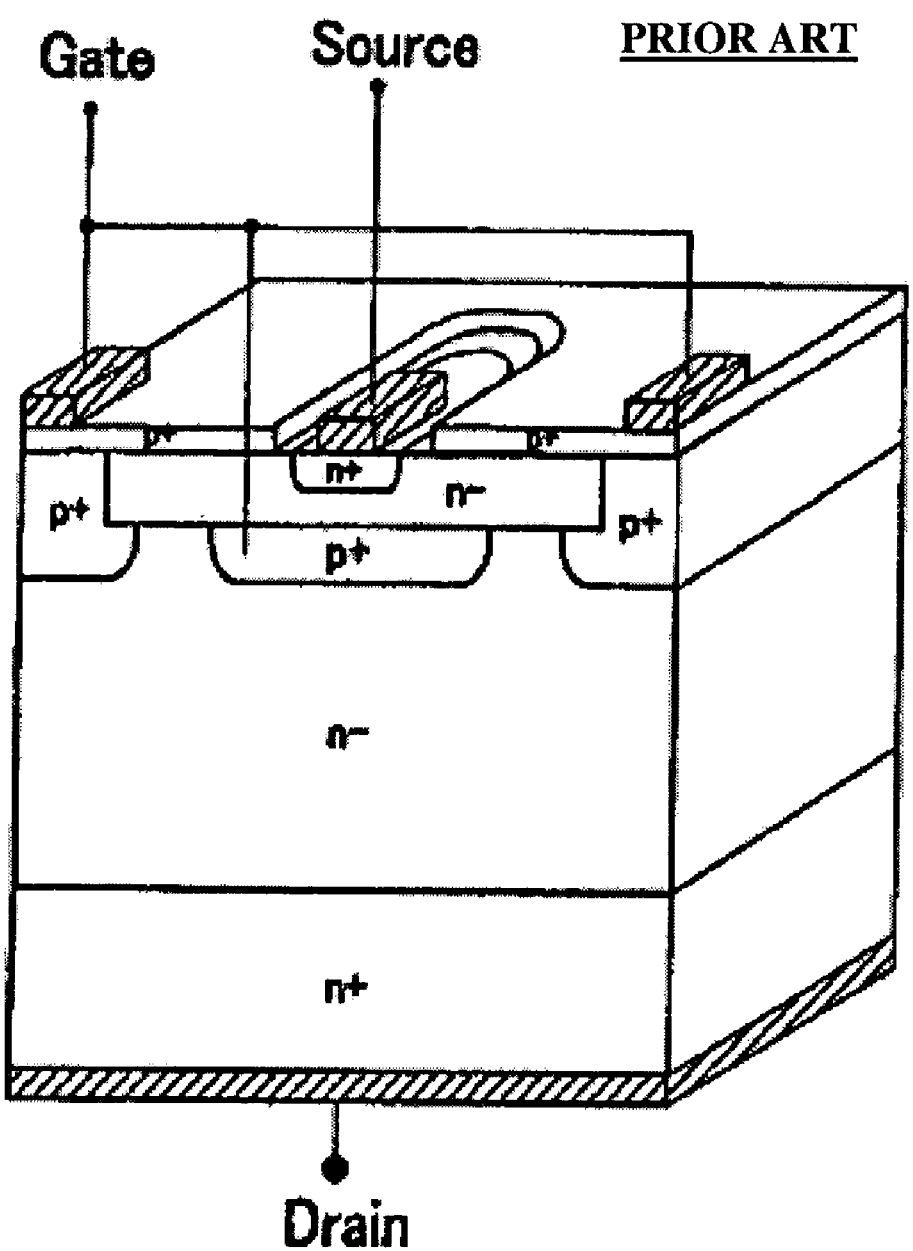
FIG. 2 shows prior art in the design of SiC VJFETs with lateral JFETs.
Figure 3:
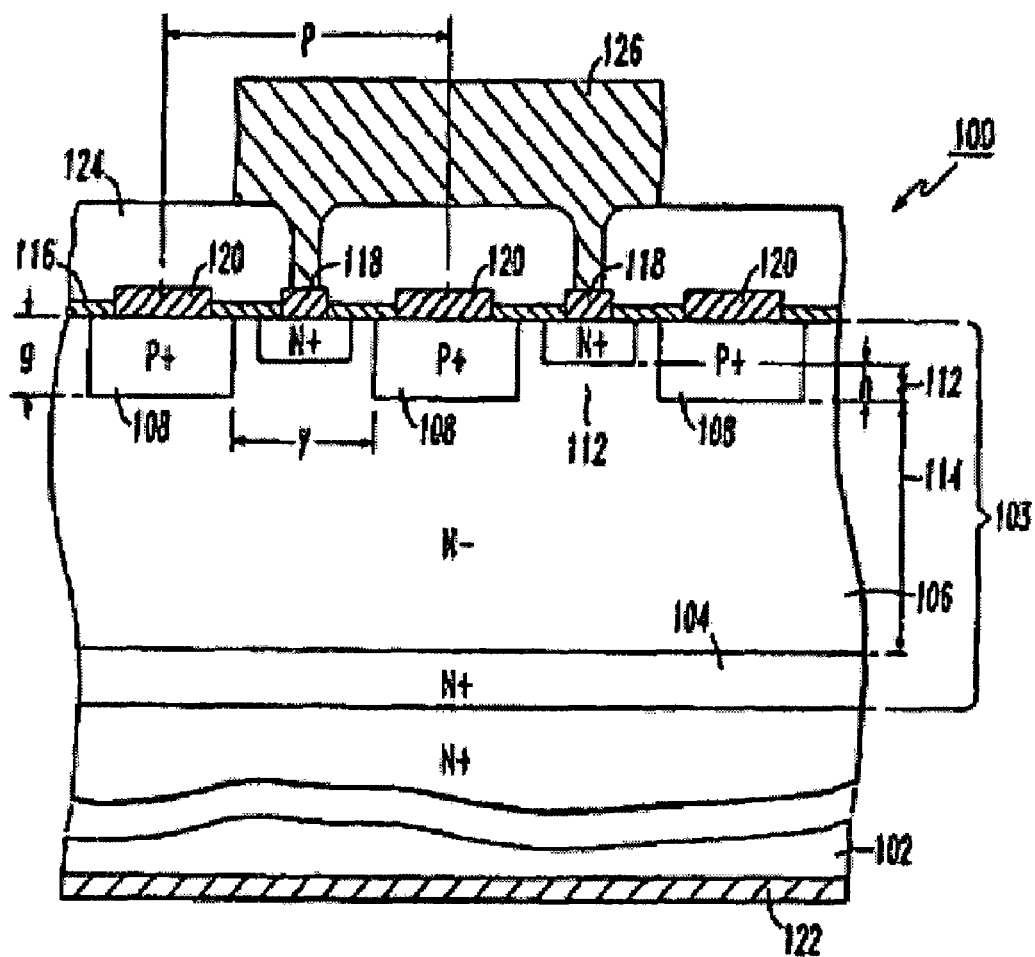
FIG. 3 shows prior art in the design of SiC static induction transistors (SIT s).
Figure 4:
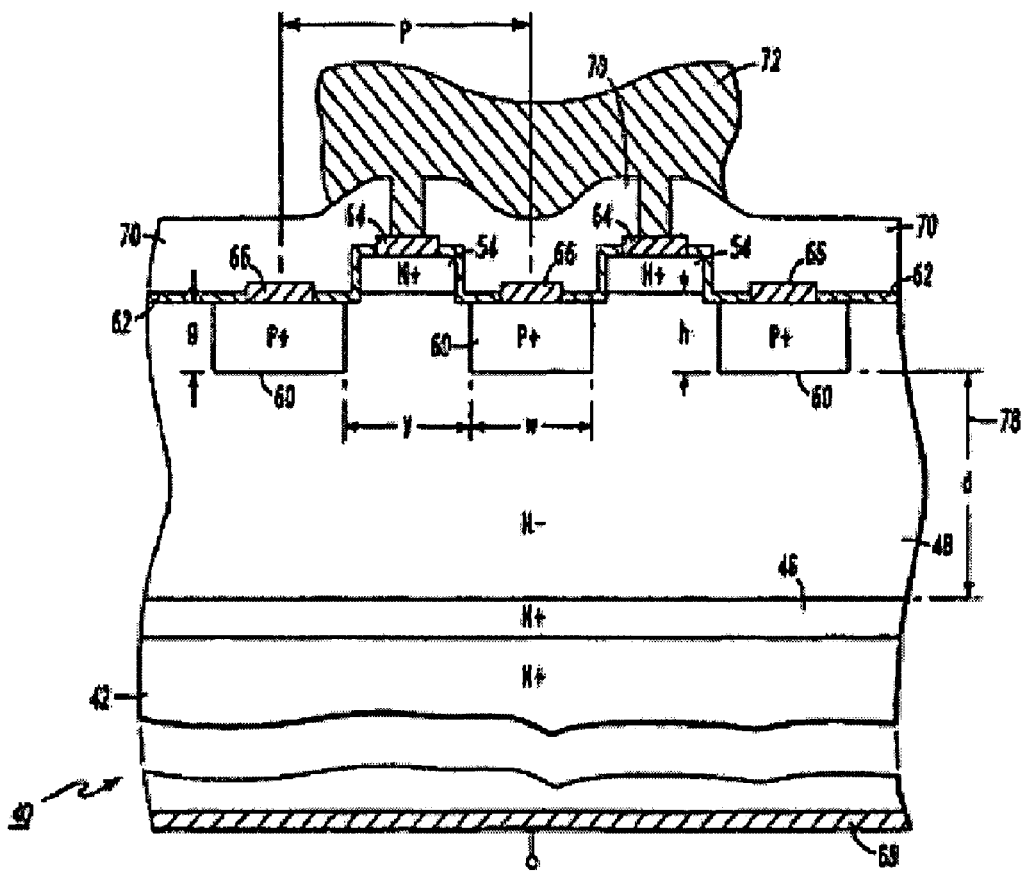
FIG. 4 shows prior art in another design of SiC static induction transistors (SIT s).
Figure 5:
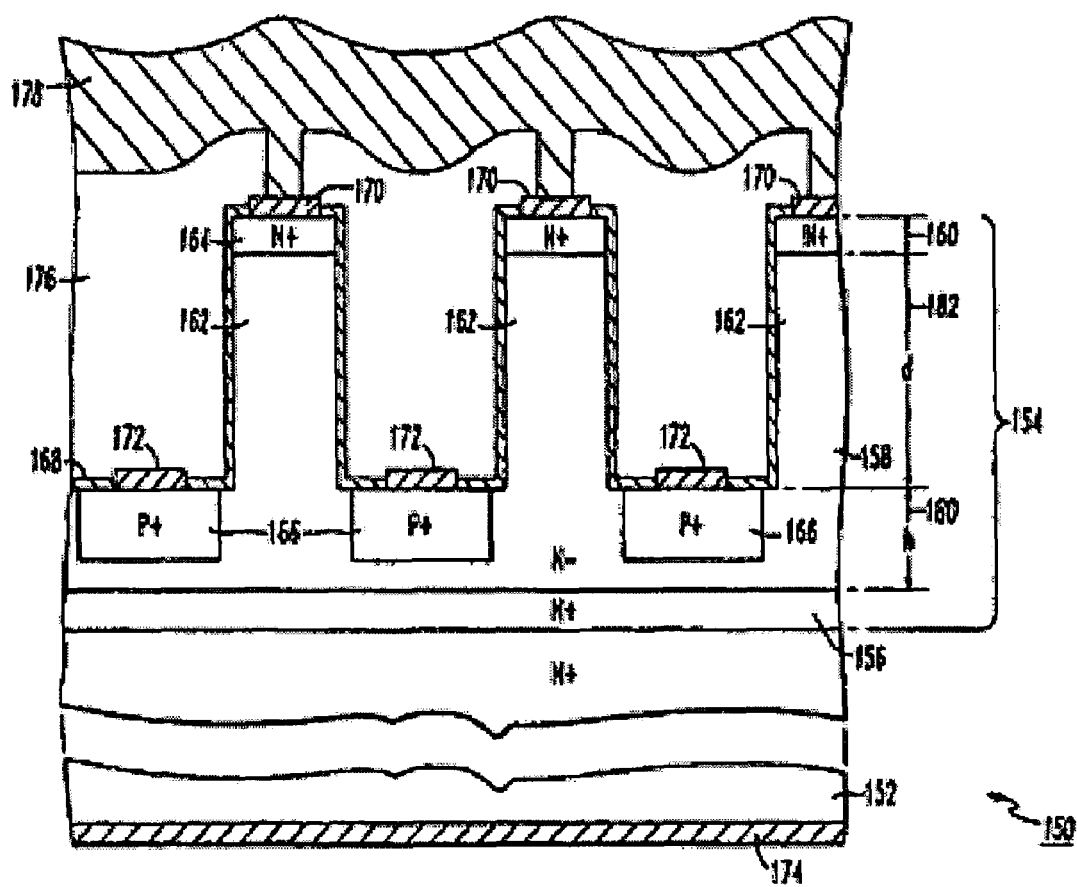
FIG. 5 shows prior art in yet another design of SiC static induction transistors (SITs).
Figure 6:
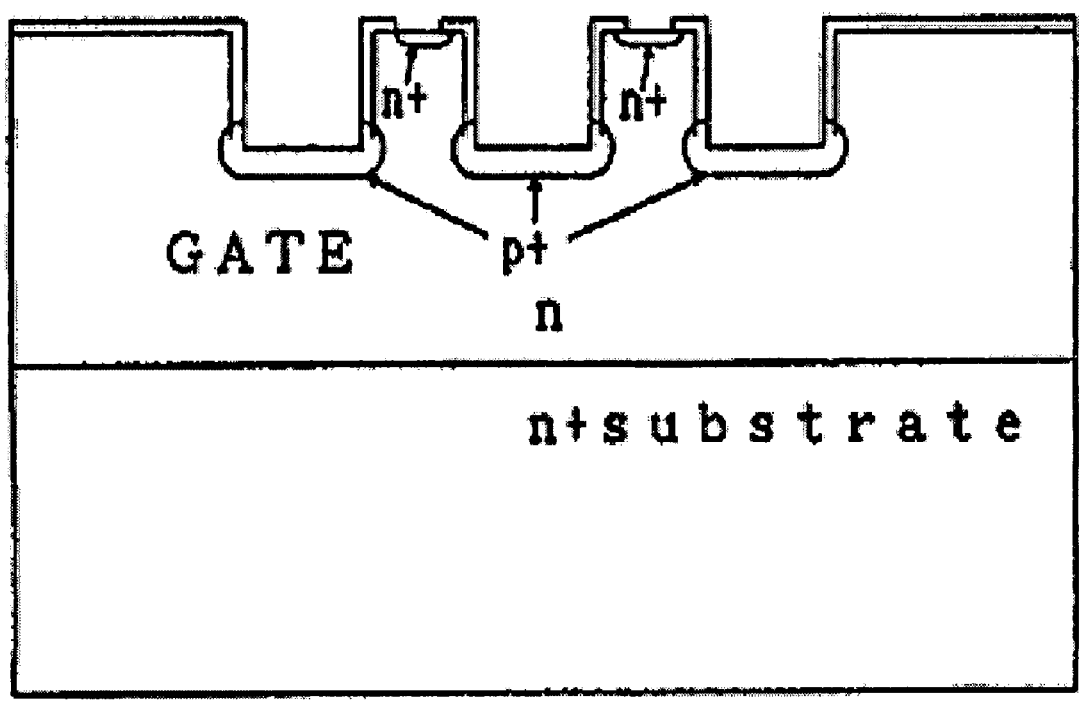
FIG. 6 shows prior art in the design of Si SITs.
Figure 7:
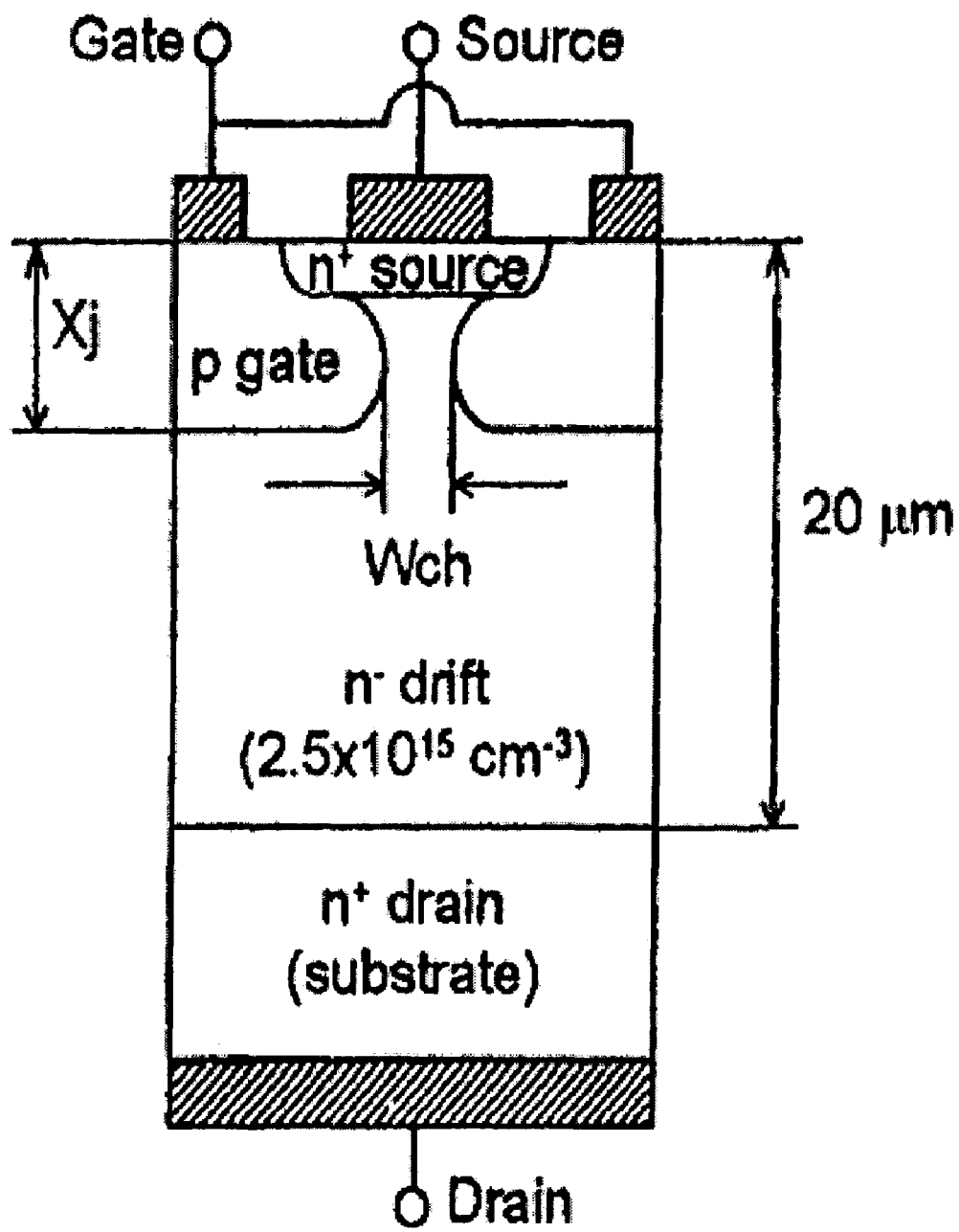
FIG. 7 shows prior art in the design of high voltage SiC VJFETs with long vertical channels.
Figure 11:
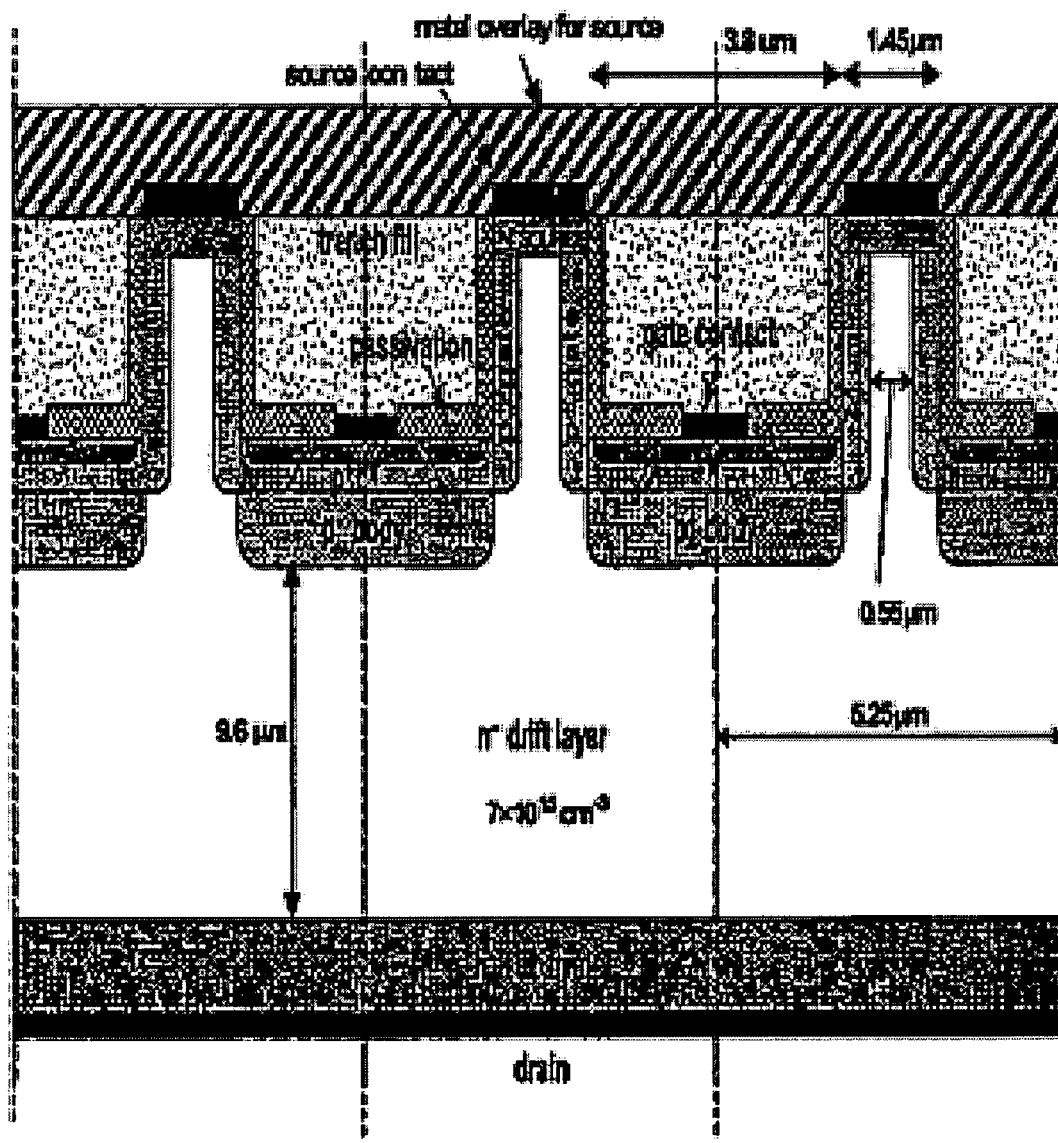
FIG. 11 shows the cross sectional view of a 4H—SiC VJFET designed and fabricated according to the invention using a single $7\times10^{15}$ cm$^{-3}$ doped n-type layer for the drift layer as well as the vertical channel n layer.
Figure 12:
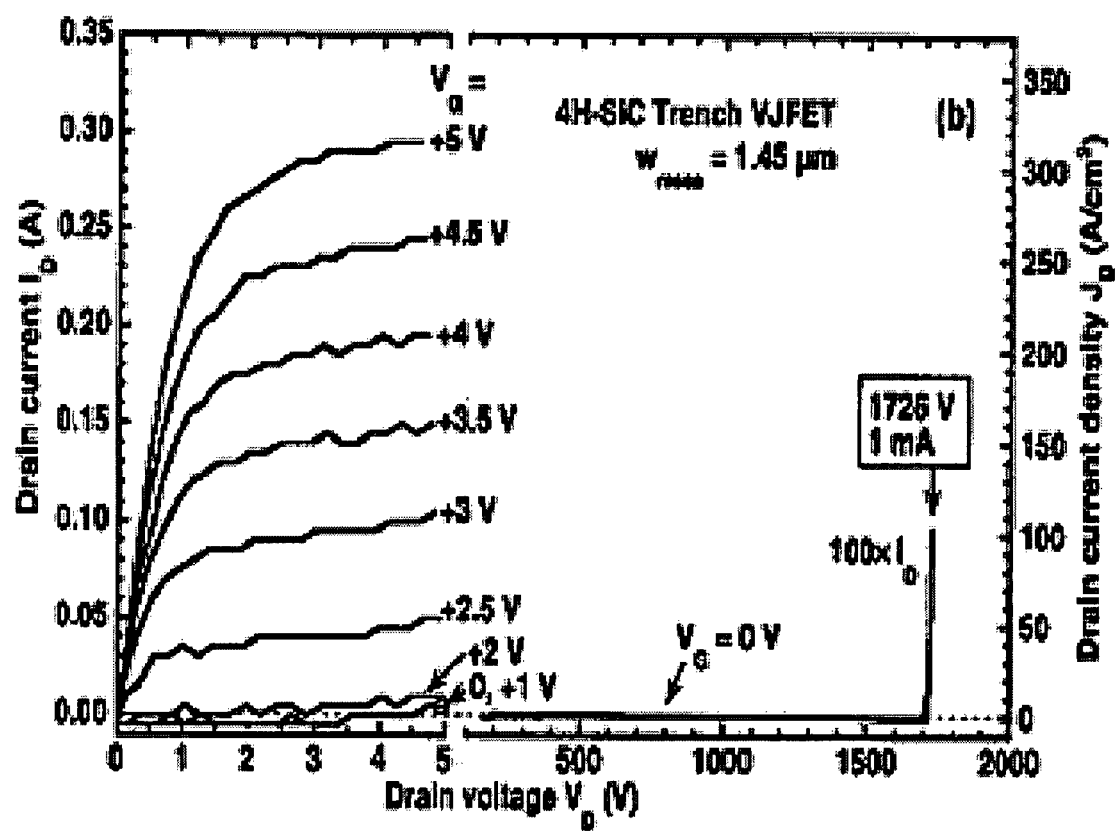
FIG. 12 shows the experimental room temperature I-V curves for the fabricated 4H—SiC VJFET.
Figure 13:
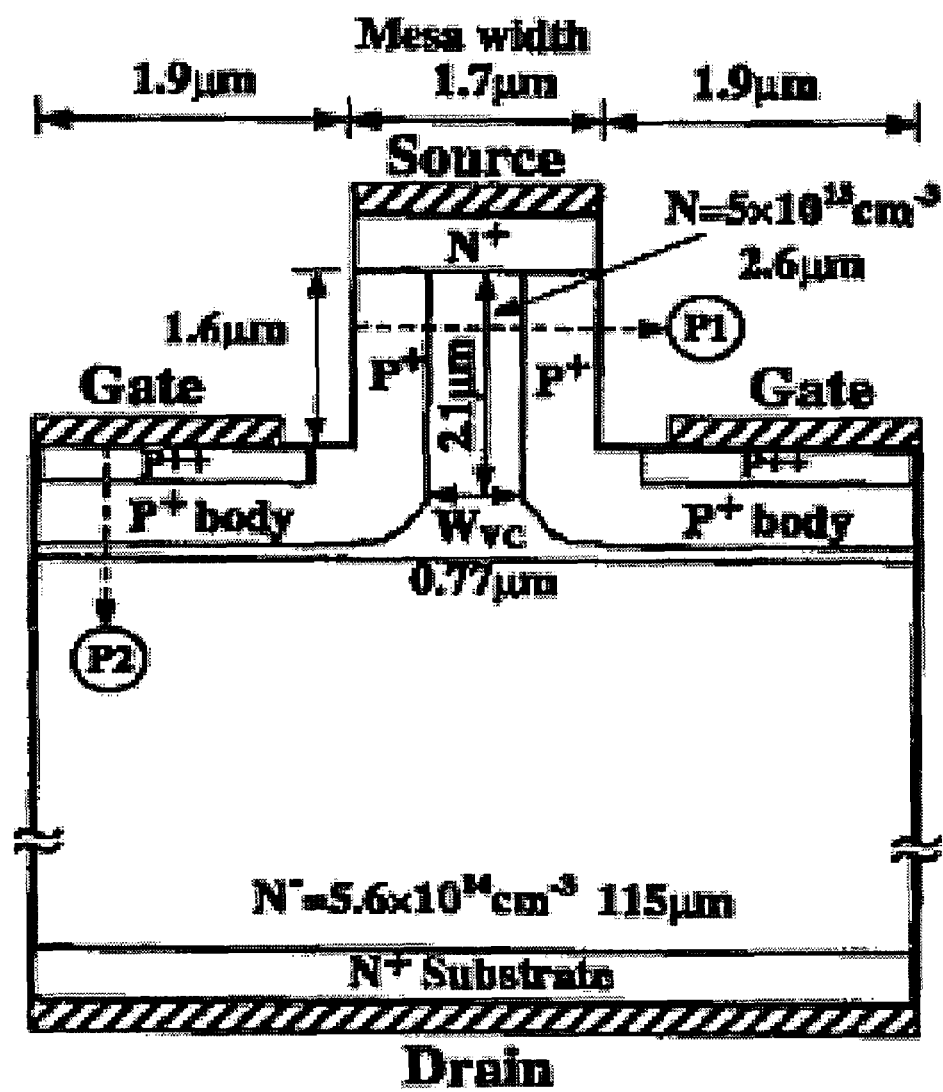
FIG. 13 shows the cross sectional view of a design for a 14 kV SiC VJFET.
Figure 14:
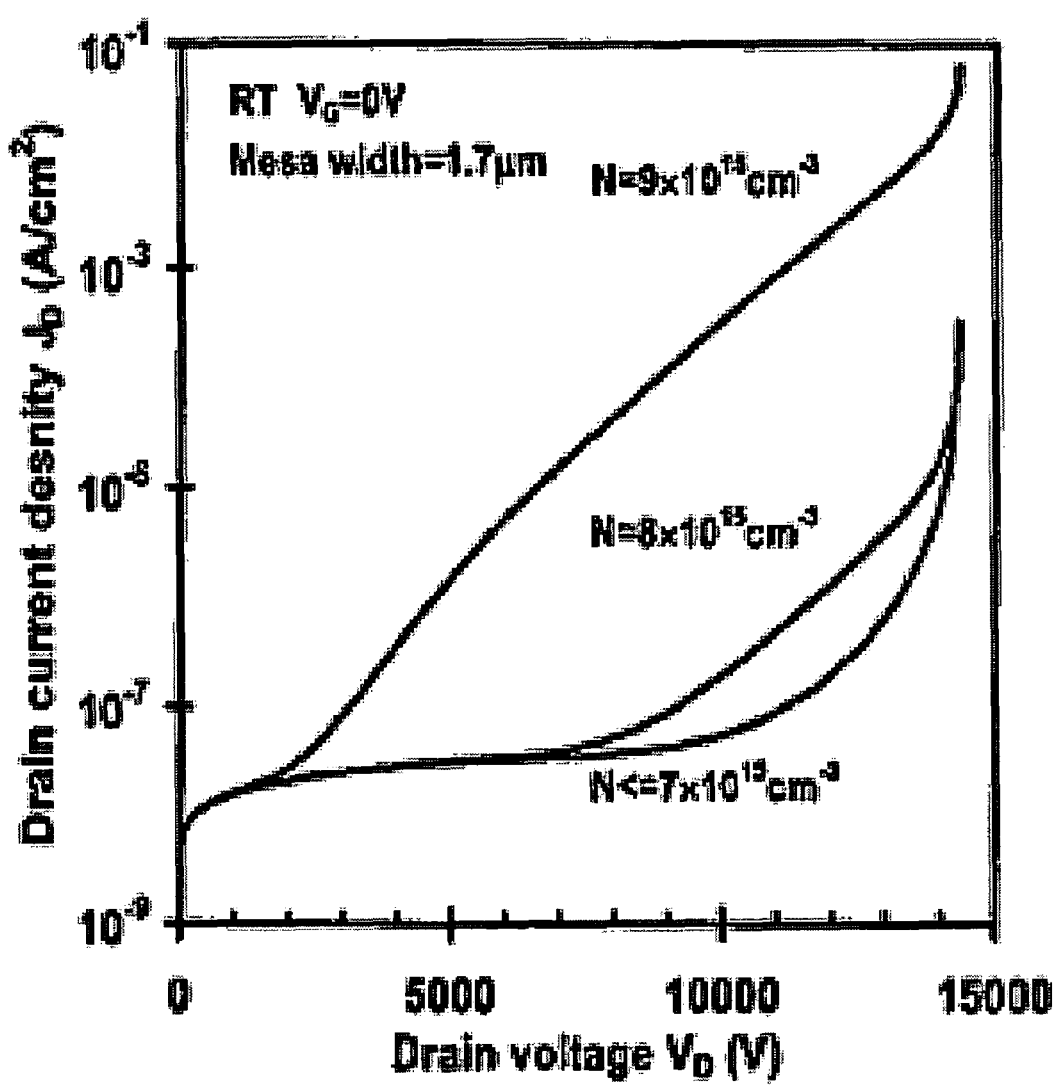
FIG. 14 shows the simulated I-V curves for the 14 kV SiC VJFET designed.

FIG. 11 shows the cross sectional view of a VJFET designed and fabricated according to the invention using a single $7 \times 10^{15}$ cm$^{-3}$ doped n-type layer for the drift layer as well as the vertical channel n layer. The length of the vertical part of the channel is designed to be 2.1 um and the channel opening dimension is highly uniform and is designed to be equal to 0.55 um. The top $n^{++}$ source contact layer is doped $1 \times 10^{19}$ cm$^{-3}$ with a large thickness of 1.6um so that self-aligned gate $p^+$ implantation can be done to form the vertical channel with a highly uniform channel opening dimension. The blocking layer thickness defined as the thickness of the n layer between the p+ body and n+ substrate is 9.4um when 0.2um p+ implantation tail is considered. The highly vertical channel is formed by first etching a deep trench of 3.2um, followed by tilted Al ion implantation onto all four sides of the mesas forming accurately controlled vertical channels of 2.1um in length and a highly uniform vertical channel opening dimension of 0.55um. The vertical channel length of 2.1um is the sum of 1.6um of the U-shaped trench depth and 0.5um of the p+ gate implantation depth. For higher blocking voltages, blocking layer doping density should be decreased and its thickness should be increased as well understood by those skilled in the art. FIG. 12 shows the experimental I-V curves for the fabricated VJFET measured at room temperature. FIG. 11 and FIG. 12 are copied from FIG. 1 and FIG. 4, respectively, in the paper entitled *3.6 mΩcm$^2$, 1,726V 4H—SiC normally-off trenched-and-implanted vertical JFETs* after J. H. Zhao et al. published by IEEE ISPSD-2003, pp. 50-52 and cited herein as reference. It is seen that the VJFET is capable of a blocking voltage ($V_{bl}$) of 1,726V with a specific on-resistance ($R_{sp}$) of 3.6 mΩcm$^2$ at a drain to source voltage of 3V and a gate-to-source bias of 5V, corresponding to a figure-of-merit of $V_{bl}^2/R_{sp}$ equal to 827MW/cm$^2$ which is the highest for any type of normally-off or normally-on SiC unipolar or bipolar power switches reported to date. In comparison to the normally-on vertical JFET by Onose et al. with 70 mΩcm$^2$ and 2 kV, this normally-off 3.6 mΩcm$^2$, 1,726V VJFET reveals the drastic advantage of the use of long vertical channels all having a highly uniform channel opening dimension defined and controlled by highly vertical $p^+n$ junctions of the present invention. FIG. 13 shows the design of a 14 kV SiC VJFET and FIG. 14 shows the simulated I-V curves for the 14 kV SiC VJFET designed with the same 2.1 um vertical channel length of FIG. 11, confirming that SiC VJFETs with up to 14 kV blocking voltage can be realized without changing the vertical channel length. FIG. 13 and FIG. 14 are copied from FIG. 8 and FIG. 9 in the paper by J. H. Zhao et al. published by IEEE ISPSD-2003, pp. 50-52.

While the preferred embodiments and specific examples are described herein those skilled in the arts would appreciate the fact that other variations are possible based on the invention. For example, the vertical channels can be formed by epitaxial refilling of p+ SiC into the U-shaped trench regions to define the desired vertical channels with a highly uniform channel opening dimension. As another example, the conductivity type of each layer can be changed to the opposite type to form a VJFET. As yet another example, double-sided epitaxial growth or double-sided ion implantation onto both sides of a bulk wafer of an appropriate thickness in the range of 100 um to 400 um and a doping density in the range of $10^{13}$ cm$^{-3}$ to $10^{15}$ cm$^{-3}$ can be used to implement the invention. As a further example, the vertical channel length, while described as 2.1 um for up to 14 kV VJFETs, can be smaller in designing lower voltage VJFETs as described in a paper published by J. H. Zhao et al. entitled *demonstration of a high performance 4H—SiC vertical junction field effect transistor without epitaxial regrowth* by IEE Electronics Letters, Vol. 39, No. 3, Feb. 6, 2003, pp. 321-323, cited here as reference, which reports an experimental normally-on VJFET blocking 392V achieving a very low $R_{sp}$ of 1.4 mΩcm$^2$ using a vertical channel length of 1.57 um and a blocking layer of only 1.33 um. As yet one more example, although SiC semiconductor is used as example of illustration, other semiconductors can be equally used to form the VJFET of the invention such as GaN, AlGaN, InGaN, diamond, AlGaAsP, Si, ZnO, MgZnO and the combinations thereof.

In the drawings and specifications described above, typical preferred embodiments have been disclosed of the invention and, although specific terms are employed, they are used in a generic and descriptive sense only and are not for purpose of limitation for the scope of the invention.

The invention claimed is:

1. A vertical junction field-effect transistor (VJFET) having a plurality of semiconductor layers, comprising:
   a drain layer of heavily doped semiconductor of a first conductivity type and operable as a drain for said transistor;
   a blocking layer of lightly doped semiconductor of the first conductivity type formed on top of said drain layer;
   a channel layer formed on top of said blocking layer; the channel layer having a plurality of vertical channels of the first conductivity type spaced apart by U-shaped regions of heavily doped semiconductor of the second conductivity type; the second conductivity type having an opposite conductivity of the first conductivity type; wherein the sides of the U-shaped regions form vertical gate junctions with said vertical channels; and
   a source layer of very heavily doped semiconductor of the first conductivity type on top of said vertical gate junctions and operable as a source for said transistor;
   wherein said vertical gate junctions produce a vertical channel opening of a uniform width for operation of the VJFET.

2. The vertical junction field-effect transistor according to claim 1, wherein the U-shaped regions are doped by angled ion implantation.

3. The vertical junction field-effect transistor according to claim 1, further comprising gate ohmic contacts to very heavily doped semiconductor of the second conductivity type formed on the inside bottom of the U-shaped regions.

4. The vertical junction field-effect transistor according to claim 3, further comprising passivation regions covering the sides of the U-shaped regions, at least part of the gate ohmic contacts, and the sides of the source layer on top of said vertical gate junctions.

5. The vertical junction field-effect transistor according to claim 4, further comprising a dielectric fill layer filling an area between the sides of the passivation regions.

6. The vertical junction field-effect transistor according to claim 1, further comprising a metal ohmic contact layer on top of the source layer.

7. The vertical junction field-effect transistor according to claim 1, wherein the VJFET is a normally-off transistor.

8. The vertical junction field-effect transistor according to claim 1, wherein the vertical gate junctions are at an angle of about ninety (90) plus or minus twenty (20) degrees with respect to said source layer.

9. The vertical junction field-effect transistor according to claim 1, wherein an opening dimension of the vertical channel opening is uniform to within 0.3 micrometers.

10. The vertical junction field-effect transistor according to claim 1, wherein the vertical channel opening has a channel length ($L_{vc}$) between 0.5 micrometers and 3.5 micrometers.

11. A vertical junction field-effect transistor (VJFET) having a plurality of semiconductor layers, comprising:
  an $n^+$-type drain layer operable as a drain for said transistor;
  an $n^-$-type blocking layer formed on top of said drain layer;
  a channel layer formed on top of said $n^-$-type blocking layer; the channel layer having a plurality of vertical n-type channels spaced apart by U-shaped $p^+$-type regions; wherein the sides of the U-shaped $p^+$-type regions form vertical $p^+n$ gate junctions with said vertical n-type channels; and
  an $n^{++}$-type source layer on top of said vertical $p^+n$ gate junctions and operable as a source for said transistor;
  wherein said vertical $p^+n$ gate junctions are operable as a gate for said transistor and produce a vertical channel opening of a uniform width for operation of the VJFET.

12. The vertical junction field-effect transistor according to claim 11, wherein the U-shaped $p^+$-type regions are doped by angled ion implantation.

13. The vertical junction field-effect transistor according to claim 11, further comprising $p^{++}$-type gate ohmic contacts to the inside bottom of the U-shaped $p^+$-type regions.

14. The vertical junction field-effect transistor according to claim 13, further comprising passivation regions covering the sides of the U-shaped $p^+$-type regions, at least part of the $p^{++}$-type gate ohmic contacts, and the sides of the $n^{++}$-type source layer on top of said vertical $p^+n$ gate junctions.

15. The vertical junction field-effect transistor according to claim 14, further comprising a dielectric fill layer filling an area between the sides of the passivation regions.

16. The vertical junction field-effect transistor according to claim 11, further comprising a metal ohmic contact layer on top of the $n^{++}$-type source layer.

17. The vertical junction field-effect transistor according to claim 11, wherein the VJFET is a normally-off transistor.

18. The vertical junction field-effect transistor according to claim 11, wherein the vertical $p^+n$ gate junctions are at an angle of about ninety (90) plus or minus twenty (20) degrees with respect to said source layer.

19. The vertical junction field-effect transistor according to claim 11, wherein an opening dimension of the vertical channel opening is uniform to within 0.3 micrometers.

20. The vertical junction field-effect transistor according to claim 11, wherein the vertical channel opening has a channel length ($L_{vc}$) between 0.5 micrometers and 3.5 micrometers.

\* \* \* \* \*

UNITED STATES PATENT AND TRADEMARK OFFICE
CERTIFICATE OF CORRECTION

PATENT NO. : 7,479,672 B2  Page 1 of 1
APPLICATION NO. : 11/784613
DATED : January 20, 2009
INVENTOR(S) : Jian H. Zhao It is certified that error appears in the above-identified patent and that said Letters Patent is hereby corrected as shown below:

Column 4, line 4, "$n^{++}0$ source" should read -- $n^{++}$ source --.
Column 9, line 26, "$n^{31}$-type" should read -- $n^-$-type --.
Column 9, line 28, "$p^{30}$-type" should read -- $p^+$-type --.
Column 9, line 29, "$p^{30}$-type" should read -- $p^+$-type --.

Signed and Sealed this

Twenty-fifth Day of May, 2010

David J. Kappos
*Director of the United States Patent and Trademark Office*